United States Patent

[11] 3,634,082

[72] Inventor Carl W. Christensen
Beverly, Mass.

[21] Appl. No. 651,700
[22] Filed July 7, 1967
[45] Patented Jan. 11, 1972
[73] Assignee Shipley Company, Inc.
Newton, Mass.

[54] LIGHT-SENSITIVE NAPHTHOQUINONE DIAZIDE COMPOSITION CONTAINING A POLYVINYL ETHER
14 Claims, No Drawings

[52] U.S. Cl. .......... 96/33,
96/36.2, 96/36.3, 96/75, 96/91 D
[51] Int. Cl. .......... G03f 7/02
[50] Field of Search .......... 96/36.3, 91,
91 D, 33; 260/844

[56] References Cited

UNITED STATES PATENTS

| | | | |
|---|---|---|---|
| 3,402,044 | 9/1968 | Steinhoff et al. | 96/91 |
| 3,131,048 | 4/1964 | Fritz | 96/36.3 |
| 2,954,474 | 11/1960 | Daniels et al. | 260/844 |

FOREIGN PATENTS

| | | | |
|---|---|---|---|
| 1,003,857 | 9/1965 | Great Britain | 96/91 |

OTHER REFERENCES

C. Schildkneckt, "Vinyl and Related Polymers," John Wiley & Sons, N.Y., 1952, pp. 593, 602, 603, 604

R. Houwink & G. Salomon, "Adhesion & Adhesives," Vol. 1, 2nd Ed., Elsevier Pub. Co., Amsterdam, 1965 pp. 303, 304, 318

*Primary Examiner*—Norman G. Torchin
*Assistant Examiner*—John Winkelman
*Attorney*—Roberts, Cushman & Grover

ABSTRACT: A photosensitive coating composition useful for the production of printing plates and for forming photoresists for metal plating and etching of metal, ceramic or the like comprising a light-sensitive diazo compound as photosensitizer, a polyvinyl ether, and preferably, an alkali soluble resinous material such as a novolak resin. The addition of the polyvinyl ether provides a coating of improved flexibility, electrical and chemical resistance, and thickness characteristics.

LIGHT-SENSITIVE NAPHTHOQUINONE DIAZIDE COMPOSITION CONTAINING A POLYVINYL ETHER

INTRODUCTION

This invention relates to photosensitive coatings and coating compositions for the production of printing plates and for forming photoresists for metal plating and etching of metal, ceramics or the like containing a light sensitive diazo compound as photosensitizer, a polyvinyl ether, and preferably, an alkali soluble resinous material such as a novolak resin. The polyvinyl ether is compatible and noninterfering with the light-sensitive compound and provides photosensitive coatings of improved flexibility, thickness and chemical and electrical resistance at lower cost.

BACKGROUND OF THE INVENTION

The production of printing plates, in particular planographic printing plates, by a process involving the formation of coatings consisting of or containing light-sensitive diazo compounds as photosensitizer and various resins such as alkali soluble novolak resins on supports such as metal plates or foils, for example, aluminum or zinc, is known. The plates are utilized by posure of the light-sensitive surface to light under a master and developed to produce a visible image by treatment with dilute alkaline solutions, for example, dilute solutions of disodium phosphate, trisodium phosphate, and the like. If a positive master is used, the image, which accepts greasy ink, is a positive reproduction of the master from which copies of the master can be made in an offset printing press.

The foregoing coating also has potential utility in forming photoresists for metal plating and for etching of metal, ceramics or the like in a pattern, for example in chemical milling or in the manufacture of printed circuits. However, known coatings of this type are frequently brittle, often provide inadequate electrical resistance for plating, inadequate chemical resistance to etching solutions which are usually acid, and known coating compositions provide thin coatings which are difficult to uniformly apply to a substrate without defects.

STATEMENT OF THE INVENTION

The present invention is predicated upon the discovery that polyvinyl ethers are compatible and noninterfering with a photosensitive coating light-sensitive diazo compounds and their addition provides a coating of substantially improved flexibility, resistance and thickness characteristics without leaving a residue following alkaline treatment. Accordingly an object of this invention is to provide a photosensitive coating composition containing a light sensitive diazo compound, a polyvinyl ether resin and preferably an alkali soluble resin such as a novolak resin; the composition providing a photosensitive coating characterized by substantially improved flexibility, increased electrical resistance for plating, increased chemical resistance to etching solution, improved thickness characteristics, and freedom from residue in light exposed portions following treatment with alkaline solution.

DESCRIPTION OF THE INVENTION

The polyvinyl ethers contemplated by the present invention are those having repeating units that may be represented by the following structural formula $$-\left(CH_2-\underset{\displaystyle OR}{\underset{|}{CH}}\right)-$$

where R is a lower alkyl of from one to four carbon atoms. The polyvinyl ethers are available in forms varying from highly viscous liquids to tough rubbery materials dependent upon the linearity of the polymer chain and the average molecular weight of the polymer. Those polymers having a K value of at least 0.015 and preferably at least 0.040 are suitable. K value is obtainable from the relationship:

$$\text{Log } n_R/C=75K^2/1+1.5KC+K$$

where $n_R$ is the relative viscosity of polymer solution, and C is the concentration of the polymer solution used to measure $n_R$ in grams per 100 ml. of solution Superior resolution of a developed image is obtained with polyvinyl methyl ether and the use of this polymer constitutes a preferred embodiment of this invention.

Small additions of the polyvinyl ether are beneficial and increasing amounts show increased improvement until insolubility in the coating composition is encountered or development is inhibited. The ratio of polyvinyl ether to the light-sensitive diazo compound may vary between about 0.5:1 to 6:1 and preferably between about 1:1 to 3:1, dependent upon the remaining constituents in the photosensitive composition.

As noted above, the polyvinyl ether is noninterfering and compatible with the remaining components of a photosensitive coating. Both of these properties are critical to obtaining the improvements resulting from the use of the polyvinyl ethers. By "noninterfering," it is meant that the polyvinyl ether does not interfere with the ability of light to decompose and convert the light-sensitive diazo compounds to alkali soluble compounds. Consequently, upon treatment with alkali, the entire light-exposed coating, including the polyvinyl ether constituent is completely removed leaving an image having excellent resolution. The term "compatible" means that large quantities of polyvinyl ether are soluble in a solution of the photosensitive coating composition and homogeneous, thick coatings are obtained upon drying. Homogeneity is necessary to obtain good resolution of a developed image following treatment with alkali. The addition of large quantities of resin without injuring image resolution is desired for at least two reasons. First, the diazo constituent of the photosensitive coating is expensive. Filling the photosensitive coating with less expensive resin without reducing image resolution results in considerable cost savings. Secondly, the use of large quantities of resin in solution results in substantially increased solution viscosity. This permits formation of thicker coatings using conventional coating procedures such as dip coating, roller coating, etc. It has been found that the polyvinyl ether, in solution, increases viscosity of the coating composition to a much greater extent that other resins used in corresponding amounts.

The light sensitive diazo compounds that may be used as the light sensitive composition of the present invention may be, for example, those disclosed in U.S. Pat. Nos. 3,046,118; 3,102,809; 3,106,465; 3,130,047; 3,130,048; 3,148,983; 3,061,430; 3,184,310; 3,188,210; 3,201,239; and 3,288,608, all included herein by reference. The light sensitive compositions may include one or a mixture of the diazo compounds.

The light sensitive diazo compounds preferably employed as photosensitizer are the water-insoluble naphthoquinone-(1,2)-diazide sulfonic acid esters having an —OH group or an esterified —OH group in a neighboring position to a carbonyl group. These compounds form coatings free of crystallization, and which, therefore are exceptionally well suited for the photomechanical preparation of printing plates and photoresists.

In addition to the light-sensitive diazo compound and the polyvinyl ether constituent, the composition preferably includes an alkali-soluble resin, exemplary of which are the phenol and cresol-formaldehyde novolaks. Even small additions are beneficial, but where highly etch resistant layers are to be produced for the preparation of photoresists, the light-sensitive compounds can be mixed with he alkali-soluble resin in proportions ranging from about 1:1 to 1:6 by weight, based upon the quantity of light-sensitive material present in accordance with procedures known to the art. Because the necessary etch resistance requires a high percentage of resin and while at the same time considerable proportions of the light-sensitive compound must be present in the layer to ensure an easy development thereof, very high demands are made upon the light-sensitive compounds with regard to their solubility and compatibility with resins. These demands are met by the light-sensitive compounds utilized in the present invention.

Due to their particular chemical structure, the light-sensitive diazo compounds utilized in the present invention have particularly favorable characteristics as regards their solubility in organic solvents at room temperature and their compatibility with high quantities of resin. These advantages facilitate the preparation of highly etch-resistant, homogeneous layers which are exceptionally suitable for the preparation of relief and itaglio printing plates as well as photoresists. Further, the photosensitive coatings of the present invention can, in contradistinction to the more cumbersome transfer processes using pigment paper, be directly applied to the metal to be etched, i.e., placed on cylinders, and the process can be further simplified due to the fact that positive copies can be produced whereas pigment paper is suitable for the production of negative copies only.

The light-sensitive compositions may also contain small quantities of the alkali resistant light-insensitive, film-forming material disclosed in copending U.S. Pat. application Ser. No. 413,286, now U.S. Pat. No. 3,402,044 incorporated herein by reference. These materials must be capable of forming a non-tacky dried film after coating within about 10 minutes at 100° C., be compatible with the photosensitizers employed, that is, mix therewith without separation and without chemical reaction, in both liquid coating and dried film form, and have a molecular weight between about 500 and 12,000. The quantity of the additive can be varied considerably and can be used in amounts up to the amount of photosensitizer.

Additional additives to the light-sensitive compositions include small quantities of additional resins, plasticizers compatible with he resins such as dioctyl phthalate, dibutyl phthalate, or mineral oil, and dyestuffs to make the coating and the developed image more visible.

The following table sets forth preferred concentration ranges for the components of the coating composition:

| Ingredient | Concentration—weight percent |
|---|---|
| Photosensitizer | 1–5 |
| Alkali-soluble resin | 4–12 |
| Polyvinyl ether | 1–10 |
| Film forming additive | 0–5 |
| Dyes, resins and plasticizers | 0–2 |
| Solvent | Remainder |

To produce a superior coating on a support, the use in the preparation of the coating solution of organic solvent in which the light sensitive diazo compounds are soluble at room temperature is advantageous. If the diazo compounds are dissolved in a heated solvent, partial decomposition results. Exemplary of suitable solvents are ethylene glycol monomethyl ether; ethylene glycol monoethyl ether; aliphatic esters, such as butyl acetate; aliphatic ketones, such as methyl isobutyl ketone and acetone; dioxane; xylene; halogenated aromatics such as chlorinated xylene, benzene and toluene, and mixtures thereof.

A printing plate is obtained photomechanically from the light-sensitive material in known manner, the light-sensitive coating being exposed under a master to the action of light and the exposed coating being developed with a dilute alkaline solution to produce an image. The developed coating is rinsed with water, and in the portions bared by the developer, the metal support is made water-conductive with treatment of approximately 1 percent phosphoric acid solution, to which dextrin or gum arabic may be added. When the printing plate is inked with greasy ink, it adheres to the remaining portions of the original light-sensitive coating and positive copies are obtained from positive masters.

Where the light-sensitive material is to be used as a photoresist, the metal support, in the portion bared by the developer, is treated with a suitable etching solution for a time sufficient to etch the metal base to the desired degree. After etching, the plate is rinsed and the remaining light-sensitive coating is removed, if desired, for example, by treatment with an organic solvent such as one of those described above as useful in the preparation of a light-sensitive coating.

The invention will be further illustrated by reference to the following examples.

EXAMPLE 1

A control solution prepared having the following composition 1. alkali-soluble phenol formaldehyde novolak resin (alnovol 429K) 18.2 g.
2. dye 0.2 g.
3. photosensitizer 6.2 g.

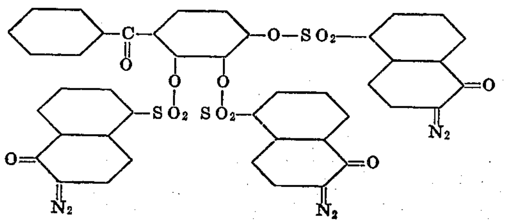

| (4) solvent(a) | to 100 ml |
|---|---|
| (a) solvent | parts by volume |
| n-butyl acetate | 1 |
| xylene | 1 |
| cellosolve | 8 |

This solution is coated onto a laminated base material, i.e., a phenolic laminate having a copper foil weighing 1 oz. per square foot laminated thereto, using a plate roller, rotating at 78 r.p.m. The light-sensitive coating solution is fed onto this finished foil at the center of rotation and the spinning is continued for a period of 5 minutes. The coating is dried as applied using a 250-watt infrared radiator mounted approximately 6 inches above the center of rotation. The coated support is then placed in a circulating air oven, at a temperature of 150° F. for about 30 minutes, to complete drying.

The coating so formed has a thickness of about 150 microns. It cracks and shales along its edge when cut with shears. Its flexibility is tested by removing a strip of the copper foil having the photosensitive coating from the phenolic substrate and folding the foil upon itself by about 90°. A coating is considered flexible if it does not separate from the copper base or crack due to this treatment. The coating prepared using the foregoing procedure flaked into brittle fragments leaving a bare copper surface upon folding through 90°.

EXAMPLES 2 to 8

The following table illustrates photosensitive compositions including a polyvinyl ether additive:

| Composition | Example No. 2 | 3 | 4 | 5 | 6 | 7 | 8 |
|---|---|---|---|---|---|---|---|
| Sensitizer [1] gm | 6.2 | 6.2 | 6.2 | 6.2 | 6.2 | 6.2 | 6.2 |
| Novolak,[1] gm | 18.2 | 18.2 | 18.2 | 18.2 | 18.2 | 18.2 | 18.2 |
| Dye, gm | 0.2 | 0.2 | 0.2 | 0.2 | 0.2 | 0.2 | 0.2 |
| Solvent [1] | To total of 100 ml. | | | | | | |
| Polyvinyl ether, gm.: | | | | | | | |
| Polyvinyl methyl ether | 10.0 | 8.0 | 8.0 | | | 5.0 | 15.0 |
| Polyvinyl ethyl ether | | 4.0 | | 5.0 | | | |
| Polyvinyl isobutyl ether | | | 4.0 | | 5.0 | | |

[1] As in Example 1

Coatings on a laminated base material were formed using the procedure of example 1, except for addition of a small quantity of solvent to reduce solution viscosity. Films so produced had a thickness of about 200 microns. None of the films broke or shaled when cut with shears nor was cracking or separation from the copper base evident upon folding 90°.

EXAMPLES 9–15

The following examples illustrate compositions containing a light insensitive, film forming additive.

| Composition | Example No. | | | | | | |
|---|---|---|---|---|---|---|---|
| | 9 | 10 | 11 | 12 | 13 | 14 | 15 |
| Sensitizer,[1] gm | 6.2 | 6.2 | 6.2 | 6.2 | 6.2 | 6.2 | 6.2 |
| Novolak,[1] gm | 18.2 | 18.2 | 18.2 | 18.2 | 18.2 | 18.2 | 18.2 |
| Dye, gm | 0.2 | 0.2 | 0.2 | 0.2 | 0.2 | 0.2 | 0.2 |
| Solvent [1] | To total of 100 ml. | | | | | | |
| Resimene 882,[2] gm | 1.8 | 1.8 | 1.8 | 1.8 | 1.8 | 1.8 | 1.8 |
| Polyvinyl ether, gm.: | | | | | | | |
| Polyvinyl methyl ether | 10.0 | 8.0 | 8.0 | | | 5.0 | 15.0 |
| Polyvinyl ethyl ether | | 4.0 | | 5.0 | | | |
| Polyvinyl isobutyl ether | | | 4.0 | | 5.0 | | |

[1] As in Example 1.
[2] Resimine 882 of the Monsanto Chemical Company, the reaction product of melamine, formaldehyde, and butyl alcohol according to Product Information Bulletin No. 1094.

Coating on a laminated base material was formed using the procedure of example 1, with the addition of a small quantity of solvent to reduce solution viscosity. All films so formed had a thickness of about 200 microns, did not break or shale upon cutting, and did not crack or separate from the copper base upon folding 90°.

EXAMPLES 16 to 26

The following table illustrates additional formulations within the scope of the invention.

| Composition | Example No. | | | | | | | | | | |
|---|---|---|---|---|---|---|---|---|---|---|---|
| | 16 | 17 | 18 | 19 | 20 | 21 | 22 | 23 | 24 | 25 | 26 |
| Sensitizer,[1] gm | 6.2 | 6.2 | 6.2 | 6.2 | 6.2 | 6.2 | 6.2 | 6.2 | 6.2 | 6.2 | 6.2 |
| Novolak,[1] gm | 18.2 | 18.2 | 18.2 | 18.2 | 18.2 | 18.2 | 18.2 | 18.2 | 18.2 | 18.2 | 18.2 |
| Dye, gm | 0.2 | 0.2 | 0.2 | 0.2 | 0.2 | 0.2 | 0 2 | 0.2 | 0.2 | 0.2 | 0.2 |
| Solvent, ml | To make 100 ml. | | | | | | | | | | |
| Polyvinylmethyl ether, gm | 10.0 | 10.0 | 10.0 | 10.0 | 10.0 | 10.0 | 10.0 | 10.0 | 10.0 | 10.0 | 10.0 |
| Film forming additive, gm.: | | | | | | | | | | | |
| Piccotex 100 [2] | 1.8 | | | | | | | | | | |
| DER 762 [3] | | 1.8 | | | | | | | | | |
| Vyset 69 [4] | | | 1.8 | | | | | | | | |
| Polyketon [5] | | | | 1.8 | | | | | | | |
| Resoflex R-296 [6] | | | | | 1.8 | | | | | | |
| Paraplex 25 [7] | | | | | | 1.8 | | | | | |
| Pliolite 5 [8] | | | | | | | 1.8 | | | | |
| Sucrose benzoate [9] | | | | | | | | 1.8 | | | |
| Piccolastic [10] | | | | | | | | | 1.8 | | |
| Derakane [11] | | | | | | | | | | 1.8 | |
| | | | | | | | | | | | 1.8 |

[1] As identified in Example 1.
[2] Alpha-methylstyrene copolymer having molecular weight of about 5,000.
[3] Epoxy resin available from Dow Chemical Company.
[4] Acrylic resin available from Monsanto Chemical Co.
[5] Ketonic resin available from Union Carbide Corp.
[6] Resinous, non-volatile, non-migrating material frequently used as a plasticizer for polyvinyl acetate available from Cambridge Industries Company.
[7] Resinous polyester plasticizer characterized by high resistance to extraction and available from Rohm and Haas Company.
[8] Thermoplastic synthetic copolymer used for alkali-resistant coating avaialble from Goodyear Tire and Rubber Company.
[9] $C_{12}H_{14}O_3(C_6H_5COO)_{7.4\ average}$, as commercially available.
[10] Soft plasticizing resine formed from styrene and styrene homologs and available from Pennsylvania Industrial Chemical Corp.
[11] Low molecular weight polyester available from Dow Chemical Company.

As in the previous examples, coatings on a laminated base were formed using the procedure of example 1. A small addition of solvent was used to reduce viscosity. All films had a thickness of about 200 microns, withstood flexing 90° without fragmenting and did not break or shale when cut with shears.

The coated laminate may be developed by exposure for about 2.5 minutes through a transparency, positive or negative, as desired using a carbon arc of an intensity of 2,000 foot candles at a distance of 1 foot as a light source. The exposed coating is then developed by immersion or swabbing with a developer such as 0.25 N potassium hydroxide, trisodium phosphate, disodium phosphate or triethanolamine. If immersion is employed, it is effected for about 1.5 to 2.5 minutes at a temperature of 70° F. Resolution of the developed image is excellent.

In addition to the more resistant, more flexible thicker coatings of greater developed resolution, photosensitive coatings produced by this invention are less expensive per unit of thickness since the proportion of the relatively expensive photosensitizer is decreased. Further the coatings permit faster, cleaner development with higher pH developers, are more tolerant to temperature and time variations in the developer, and provide smoother, harder coatings with improved heat resistance. Thus, while the light-sensitive materials according to this invention can be advantageously used in the preparation of planographic printing plates and the like, they are of particular utility in the production of photoresists for metal plating or for the etching of metal, ceramic and plastics, useful in chemical milling and in the manufacture of semiconductors in printed circuits.

It will be obvious to those skilled in the art that many modifications may be made within the scope of the present invention without departing from the spirit thereof, and the invention includes all modifications within the scope of the appended claims.

I claim:

1. An alkali developable photosensitive composition comprising a naphthoquinone-(1,2)-diazide sulfonic acid ester, an alkali soluble novolak resin and a polyvinyl ether consisting essentially of the repeating structural formula

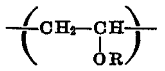

where R is a lower alkyl; said polyvinyl ether having a K value of at least 0.015 where K is defined by the equation $$\text{Log } n_R/C = 75K^2/1+1.5KC+K$$

and $n_R$ is the relative viscosity of the polyvinyl ether, and

C is the concentration of the polyvinyl ether used to measure $n_R$ in grams per 100 ml. of solution.

2. The composition of claim 1, where the polyvinyl ether has a K value of at least 0.040.

3. The composition of claim 1 where the polyvinyl ether is a polyvinyl methyl ether.

4. The composition of claim 1 where the polyvinyl ether is a polyvinyl ethyl ether.

5. The composition of claim 1 where the ratio of the polyvinyl ether to photosensitizer varies between 0.5:1 and 6:1.

6. The composition of claim 1 where the ratio of polyvinyl ether to photosensitizer varies between 1:1 and 3:1.

7. The composition of claim 1 including as an additional additive a film-forming material which is alkali-resistant, light-insensitive forms a nontacky dried film within 10 minutes at 100° C., is compatible with he photosensitizer composition, and has a molecular weight ranging between 500 and 12,000.

8. The composition of claim 7 where the film forming material is selected from the group consisting of polystyrene; alpha methyl copolymer; the polymeric reaction product of melamine, formaldehyde, and a lower alkyl monoalcohol; the polymeric reaction product of benzoguanamine, formaldehyde and a lower alkyl monoalcohol; and sucrose benzoate.

9. The composition of claim 1 where the ratio of polyvinyl ether and novolak resin to photosensitizer is as follows:

| | |
|---|---|
| polyvinyl ether | 0.5:1 to 6:1 |
| novolak | 1:1 to 6:1 |

10. A coating composition comprising the composition of claim 1 dissolved in solvent.

11. The coating composition of claim 10 where the solvent is selected from the group consisting of a glycol monoalkyl ether an aliphatic ester, an aliphatic ketone, a monocyclic aromatic and mixtures thereof.

12. The coating composition of claim 10 having the following composition:

| | |
|---|---|
| Photosensitizer | 1–5 wt. percent |
| novolak | 4–12 wt. percent |
| polyvinyl ether | 1–10 wt. percent |
| film forming additive | 0–5 wt. percent |
| dyes and plasticizers | 0–2 wt. percent |
| solvent | remainder |

13. Light-sensitive material adapted for use as a photoresist comprising a base having on at least one surface thereof a dry coating having the composition of claim 1.

14. The method of making a photoresist which comprises providing a coating composition on a base according to claim 13, exposing said coating to light in a predetermined pattern, and treating the exposed coating with weakly alkaline developing solution to remove exposed coating without removing unexposed portions.

* * * * *